United States Patent
Hatakeyama

(10) Patent No.: US 7,817,696 B2
(45) Date of Patent: Oct. 19, 2010

(54) SURFACE EMITTING LASER

(75) Inventor: Hiroshi Hatakeyama, Minato-ku (JP)

(73) Assignee: NEC Corporation, Tokyo (JP)

( * ) Notice: Subject to any disclaimer, the term of this patent is extended or adjusted under 35 U.S.C. 154(b) by 34 days.

(21) Appl. No.: 12/294,032

(22) PCT Filed: Mar. 23, 2007

(86) PCT No.: PCT/JP2007/056056
§ 371 (c)(1),
(2), (4) Date: Mar. 25, 2009

(87) PCT Pub. No.: WO2007/116659
PCT Pub. Date: Oct. 18, 2007

(65) Prior Publication Data
US 2010/0054290 A1 Mar. 4, 2010

(30) Foreign Application Priority Data
Mar. 23, 2006 (JP) .............................. 2006-081701

(51) Int. Cl.
H01S 5/00 (2006.01)
(52) U.S. Cl. .............................. 372/50.124; 372/43.01; 372/45.01
(58) Field of Classification Search .............. 372/43.01, 372/45.01, 50.124
See application file for complete search history.

(56) References Cited

U.S. PATENT DOCUMENTS

| 5,978,408 | A * | 11/1999 | Thornton | 372/96 |
| 6,852,558 | B2 * | 2/2005 | Lee et al. | 438/32 |
| 6,904,072 | B2 * | 6/2005 | Cox et al. | 372/46.01 |
| 6,990,128 | B2 * | 1/2006 | Koyama et al. | 372/18 |
| 7,031,363 | B2 * | 4/2006 | Biard et al. | 372/45.01 |
| 7,068,696 | B2 * | 6/2006 | Ezaki et al. | 372/46.01 |
| 7,433,381 | B2 * | 10/2008 | Wang et al. | 372/50.124 |
| 2002/0141472 | A1 * | 10/2002 | Koyama et al. | 372/96 |
| 2004/0141536 | A1 * | 7/2004 | Liu et al. | 372/43 |

(Continued)

FOREIGN PATENT DOCUMENTS

JP 10-27938 A 1/1998

(Continued)

Primary Examiner—Minsun Harvey
Assistant Examiner—Phillip Nguyen
(74) Attorney, Agent, or Firm—Sughrue Mion, PLLC

(57) ABSTRACT

VCSELs with a conventional oxide-confined structure have problems to be solved for the purpose of reducing the internal stress and thermal resistance of the device. In particular, the problems should be solved in order to achieve the high reliability of the high-speed modulation-type VCSELs. A surface emitting laser according to an embodiment of the present invention comprising a single current injection opening area, which is provided in a mesa and electrically and optically isolated, wherein the laser comprises: an active layer for emitting light resulted from current injection; a first reflector and a second reflector provided so as to sandwich the active layer between the reflectors, an n electrode and a p electrode for injecting current into the active layer, an ion-implanted nonconductive high-resistance area provided so as to surround the current injection opening area, and
   a half cross section in which the nonconductive oxidized layer does not appear is present among radial half cross sections extending from a substantial center of the current injection opening area to an outer periphery of the surface emitting laser, which cross sections are interrupted within a region where a laser emitting light is present.

17 Claims, 7 Drawing Sheets

U.S. PATENT DOCUMENTS

| | | | |
|---|---|---|---|
| 2005/0089075 A1* | 4/2005 | Baba et al. | 372/50 |
| 2006/0187991 A1* | 8/2006 | Thornton | 372/46.013 |
| 2007/0019696 A1* | 1/2007 | Lai et al. | 372/46.01 |
| 2007/0202622 A1* | 8/2007 | Baba et al. | 438/29 |

FOREIGN PATENT DOCUMENTS

| | | |
|---|---|---|
| JP | 10-229248 A | 8/1998 |
| JP | 2003-110196 A | 4/2003 |
| JP | 2003-324251 A | 11/2003 |
| JP | 2005-45243 A | 2/2005 |
| JP | 2005-86054 A | 3/2005 |
| JP | 2005-142361 A | 6/2005 |
| JP | 2005-310917 A | 11/2005 |
| JP | 2005-311175 A | 11/2005 |
| JP | 2006-196830 A | 7/2006 |

* cited by examiner (a)

(b)

(a)

(b)

SURFACE EMITTING LASER

TECHNICAL FIELD

The present invention relates to a surface emitting laser.

BACKGROUND ART

In recent years, efforts have been made to develop vertical cavity surface emitting lasers (VCSELs) as small-sized, low power-consumption, and inexpensive light sources for optical communication. VCSELs that can be modulated at a high rate of about 1 to 10 Gbps have already been put to practical use. A well-known structure employed for said high-speed modulation VCSELs is an oxide-confined structure formed by utilizing a steam oxidation process. First, with reference to FIGS. 5(a) and 5(b), the structure of a VCSEL in a first conventional example and a manufacturing process thereof will be explained. FIGS. 5(a) and 5(b) are a plan view of a VCSEL with a mesa-post oxide-confined structure and a sectional view taken along line E-E' in FIG. 5(a) and illustrating the structure of a half cross section extending from the substantial center of a light emitting area to the outer periphery of its mesa. Reported examples of a VCSEL comprising the oxide-confined structure include, for instance, Non-Patent Document 1: KONDO et al., "Lasing Performance of a Highly Strained GaInNa/GaAs Quantum Well Surface emitting Laser", Collection of Synopses (Autumn, 2003) for the 64$^{th}$ Annual Meeting of the Japan Society of Applied Physics, 30a-YB-3.

A process for manufacturing the aforementioned VCSEL will be explained with reference to the structure of the half cross section illustrated in FIG. 5(b). First, a laser structure portion comprising a semiconductor layered structure is formed on a substrate 113. Here, the semiconductor layered structure comprises active layer 111, p-DBR (Distributed Bragg Reflector) 109, n-DBR 112, and oxidizable layer 110. The oxidizable layer 110 is made up of an AlGaAs layer typically having a high aluminum content x of at least 0.95 contained in total of III group elements thereof. Position of the oxidizable layer 110 to be interposed is either over or under the active layer, or each of the layers is arranged both over and under the active layer.

Then, the layered structure is masked and selectively etched to form mesa 101. As a result of the etching, a part of the semiconductor layered structure comprising oxidizable layer 110 with the high aluminum content is exposed on a side surface of mesa 101. Then, in the steam-oxidation confining step, a partial area of the oxidizable layer 110 is oxidized to convert the area into an electrically insulated steam oxidized film, and thereby nonconductive oxidized layer 117 is formed. Thus formed is a light emitting area 105 with an oxide-confined structure in which the nonconductive oxidized layer 117 is employed as an insulating layer that narrows the range of current injection into active layer 111. Subsequently, the following are carried: a step of forming dielectric protection film 107 and a buried structure made of polyimide 108 to reduce the electric capacitance of an electrode pad, a step of forming a p electrode and an n electrode, and other steps. As a result, a VCSEL device is completed.

Now, the steam-oxidation confining step and functions of the oxidizable layer 110 will be described. The steam-oxidation confining step is such a step in which the substrate with the mesa formed thereon is exposed in an environment supplied with hot steam or a gas, liquid, or solid which allows water to be generated as a result of chemical reaction for predetermined duration. Thus, oxidizable layer 110 with the high aluminum content is selectively oxidized laterally from the side surface toward the center of the mesa 101 and thus converted into a steam oxidized film, and thereby the nonconductive oxidized layer 117 is formed. At the step, since the other layers are formed of an AlGaAs layer with a lower aluminum content than the oxidizable layer 110, that is, with x of 0.95 or less, the progress of the oxidation thereof is limited to such a low level that has by no means any adverse effects on the manufacture of the devices or on the performance of thus manufactured devices. At the steam-oxidation confining step, semiconductor layers composing a DBR section are oxidized, and thus a part of the semiconductor layers are converted into oxidized films. The extension width of the nonconductive oxidized layers formed in the DBR section is typically one-fifth or less of that of the nonconductive oxidized layer formed in the oxidizable layer 110.

As described above, as a result of the oxidation process, in the formation, in oxidized area 102, the nonconductive oxidized layer 117, made up of an electrically insulating steam oxidized film is formed. On the other hand, the conductivity of non-oxidized area 103 is maintained even after the oxidation process. Thus, during VCSEL driving, as the nonconductive oxidized layer 117 functions as a current barrier, no current flows to oxidized area 102 in which the nonconductive oxidized layer 117 is interposed, but current is injected into the active layer 111 only through non-oxidized area 103. Consequently, lasing light is generated by emissive recombination occurring in active layer 111, into which current is injected through the non-oxidized area 103. In the conventional example illustrated in FIG. 5, the planar shape of the light emitting area depends on that of current injection opening area 105. In the conventional example, in any cross sections passing through the substantial center of current injection opening area 105 in the plan view in FIG. 5(a), the path of current injection is defined by the boundary between the oxidized area 102 and non-oxidized area 103.

Furthermore, the oxidizable layer 110 and nonconductive oxidized layer 117 not only determine the planar shape of current injection opening area 105 but also has a refractive index waveguide function for laser light. That is, the nonconductive oxidized layer 117, made up of the steam oxidized film, has amorphous aluminum oxide-like composition, so that its optical refractive index is lower than that of the oxidizable layer 110 included in the non-oxidized area 103. Such a refractive index distribution optically forms a clad/core structure, and has a function equivalent to a focusing lens, so that it acts as an intensive waveguide structure to concentrate light generated during laser driving within the non-oxidized area 103 and its vicinity.

Such an optical waveguide structure provides improvement in the stability of a mode of lasing and increased overlapping between the current injection opening area and the light intensity distribution area, which improves mode gain, resulting in improvement in the lasing efficiency. Achievement of a high mode gain is very important in realizing high-speed modulation of 1 Gbps or higher. The planar distribution shape of the laser emitting area during VCSEL driving depends on the efficiency of the refractive index waveguide function due to the above-described clad/core structure. In the case of a device with a very efficient refractive index waveguide structure, the spread of light from non-oxidized area 103 to oxidized area 102 is inhibited, and thus, the planar shape of the light emitting area can be considered to be almost the same as that of current injection opening area 105. On the other hand, in the case of a device with a less efficient refractive index waveguide structure, the considerable contribution of the spread of light from non-oxidized area 103 to oxidized area 102 makes the light emitting area larger than current injection opening area 105. In the present invention, on basis of a light emitting power intensity (peak intensity) observed substantially in the center of current injection opening area 105, an area with a light emitting power intensity that is at least one-tenth of the peak intensity is defined as a light emitting area.

Now, the functions and advantages of the oxide-confined structure are summarized.

1) Current limiting function: the current-confined structure can be easily formed by the use of an insulating oxidized layer (nonconductive oxidized layer made up of a steam oxidized film);

2) Refractive index control function: an intensive refractive index waveguide structure can be introduced in the vicinity of the active layer without buried re-grown structure.

Now, a second conventional example of a VCSEL with an oxide-confined structure will be described with reference to FIGS. 6(*a*) to 6(*c*). FIG. 6(*a*) is a plan view of a VCSEL with a trench structure formed by using a plurality of oxidized areas. FIGS. 6(*b*) and 6(*c*) are sectional views illustrating the structures of half cross sections passing through the center of the current injection opening area. FIG. 6(*b*) illustrates a half cross section corresponding to a direction in which the cross section contains no trench (F-F' half cross section), and FIG. 6(*c*) illustrates a half cross section corresponding to a direction in which the cross section contains a trench (G-G' half cross section).

The manufacturing process and basic structure of the second conventional example are similar to those of the first conventional example. Thus, only characteristic parts of the second conventional example will be described below. In the second conventional example, first, instead of the mesa-post, a plurality of radially arranged trenches 201 are formed. In the subsequent steam oxidation step, the oxidized area 102 is formed in each of the plurality of trenches 201 so as to start to extend from a side surface of the trench. At the step, by appropriately selecting the location and size of trench 201 and the size of the oxidized area, the non-oxidized area 103 is formed in the vicinity of the center of the radial trench arrangement and around the outer periphery of the radial trenches when fronts of oxidized area 102 starting to extend from each trench come into contact with each other. Then, to prevent possible current leakage to outer peripheral non-oxidized area 103, high-resistance area 104 is formed by means of proton implantation or the like to form final current injection opening area 105. The structure of the second conventional example is equivalent to that of the first conventional example in that the periphery of current injection opening area 105 is covered with the oxidized area 102 and in that in any half cross sections passing through the substantial center of current injection opening area 105, the nonconductive oxidized layer 117 (oxide-confined layer) functions as a current limiting and refractive index controlling component.

Further, as a third conventional example, reported was such an invention relating to two-dimensional dense integration of a VCSEL with a trench-shaped oxide-confined structure, as disclosed in Patent Document 5: JP 10-229248 A. In the third conventional example, in such planar arrangement that equilateral triangles, squares, regular hexagons, or the like are arranged in a plane so as not to form any clearance, circular trenches are two-dimensionally arranged at the position of each vertex thereof to form an oxide-confined structure.

In similar to the case with the second conventional example, in the case of the third conventional example, when oxidation is performed to the degree that the adjacent trench oxidation fronts overlap, the adjacent trench oxidation fronts two-dimensionally contact each other. As a result, current injection opening areas (non-oxidized areas) the periphery of which is surrounded by the oxidized area are formed in a two-dimensional array. After the oxidation confining step is carried out, the area between the adjacent current injection opening areas is converted to the high resistance area by means of proton implantation or the like. In such a case, the proton implantation is performed for electric separation. Thus, the presence of the proton implantation step has no influence on the optical behavior of each of the current injection opening areas (light emitting areas). The above-described process is used to form a two-dimensional array composed of independently drivable VCSELs, in which array the devices are densely arranged.

The layout of the third conventional example allows the adjacent VCSELs to share the oxidized area and is thus advantageous in integration density compared to the case of dense array composed of mesa-post oxide-confined VCSELs.

Technical documents relating to the present invention include Patent Documents 1 to 5 and Non-Patent Documents 1 to 3 listed below.

Patent Document 1: JP 2003-110196 A
Patent Document 2: JP 2005-45243 A
Patent Document 3: JP 2005-311175 A
Patent Document 4: JP. 2005-310917 A
Patent Document 5: JP 10-229248 A
Non-Patent Document 1: KONDO et al., "Lasing Performance of a Highly Strained GaInNa/GaAs Quantum Well Surface emitting Laser", Collection of Synopses (Autumn, 2003) for the 64th Annual Meeting of the Japan Society of Applied Physics, 30a-YB-3
Non-Patent Document 2: Michael H. MacDougal, et al., "Thermal Impedance of VCSEL's with AlOx—GaAs DBR's", IEEE Photonics Technology Letters, Vol. 10, No. 1, pp. 15-17, 1998
Non-Patent Document 3: P. O. Leisher, et al., "Proton implanted single mode holey vertical-cavity surface-emitting lasers", Electronics Letters, Volume 41, Issue 18, Sep. 1, 2005, pp. 1010-1011

DISCLOSURE OF THE INVENTION

Problems to be Solved by the Invention

As described above, the oxide-confined structure has such a great advantage that the current-confined structure and the intensive refractive index waveguide structure, which is essential for high-speed modulation, can be simultaneously formed. On the other hand, the oxide-confined structure has problems relating to the reliability of the surface emitting laser device.

One of the problems is that as the oxidized area, which is an amorphous aluminum oxide layer, is introduced into a semiconductor layer, made up of an originally integrally formed single-crystalline layered structure, a high internal stress is present in the vicinity of the oxidized layer. Thus, in the mesa-post VCSEL as shown in the first conventional example, the mesa-post may be occasionally broken across the oxidized layer. The increased frequency of the breakage is significant when the wider size of the oxidized area is selected. In the trench VCSEL as shown in the second conventional example, as the p-DBR section is integrally formed in a radial direction from the current injection opening area (light emitting area) to the outer periphery of the trench, there is no possibility that breakage across the oxidized layer would happen to occur. However, in the oxidized area between the adjacent trenches, the p-DBR section and the semiconductor layer, comprising the active layer and lower layers, are coupled together only via the oxidized layer, which structure also contains a high internal stress. For the VCSEL, which is very often used in variety of mounting styles such as array mounting and resin molding, the presence of the high internal stress may be a bottle neck for improvement of the reliability of the device.

Another problem with the oxide-confined structure is that the structure is disadvantageous in reducing the thermal resistance of the device. The volume of the active layer in the light emitting area of the VCSEL is at least one order of magnitude smaller than that in the light emitting area of conventional end emitting LDs, and the VCSEL has a higher device resistance. Thus, in the case of the VCSEL, a quantity of heat generated owing to Joule heat during driving is relatively large, and resulted increase in the temperature of the device is large. This tendency is more significant in devices driven at higher modulation rates. For instance, in the case of a VCSEL for 10-Gbps modulation, a diameter of the current injection opening area (light emitting area) is selected in about 4 to 6 µm, and the resulted device resistance is ranged in about 70 to 150Ω. Thus, the temperature of the active layer during driving rises up to such a level of about +50° C. higher than an environmental temperature. On the other hand, the most important parameter determining the reliability of the VCSEL is the temperature of the active layer during driving, so that a reduction in the quantity of heat generated during driving and improvement of heat diffusion to the exterior of the VCSEL is an approach for achieving high reliability is.

Now, the heat diffusion of the VCSEL with the oxide-confined structure will be discussed by referring to the mesa-post VCSEL as shown in FIGS. 5(a) and 5(b). Here, a mounting structure is assumed in which heat is diffused out through a heat diffusing component such as a heat sink, on which a back surface of substrate 113 is mounted by solder-bonding. In the sectional view shown in FIG. 5(b), during driving, heat is generated in the active layer 111 and the vicinity thereof contained in the current injection opening area 105. The generated heat diffuses out from the active layer 111 contained in current injection opening area 105, and as a result, the distribution of a high-temperature area is schematically illustrated as heating-up area 115. Heat diffusion path 116 is also schematically illustrated with arrow symbol. Part of the heat is diffused out from the heating-up area 115 to the back surface of substrate 113 while spreading through an angle of about 45 degrees as illustrated by the arrows 1 and 2 for the heat diffusion path 116. On the other hand, heat diffused out from a side portion of the heating-up area 115 facing to p-DBR 109 diffuses laterally as illustrated by arrow 3 and is then diffused out to n electrode 114 (the back surface of substrate 113).

Here, the outer area of the mesa-post is covered with dielectric protection film 107 and polyimide 108, of which thermal conductivities are, in general, low. The outer area thus fails to serve as an effective heat diffusion path. In the case of the oxide-confined structure type of VCSEL, its essential step of steam oxidation requires the formation of mesas or trenches, which prevent heat diffusion. Moreover, the mesas or trenches formed need to be filled with dielectric material or polyimide in order to reduce the electric capacitance and to improve the device reliability. However, the dielectric material and polyimide generally are materials being poor in thermal conductivity, which is thus a hurdle to be cleared away. As to a way for improving the heat diffusion of the heat diffusion path shown by arrow 3, increasing the diameter of the mesa is effective to some degree, as described in Non-Patent Document 1: KONDO et al., "Lasing Performance of a Highly Strained GaInNa/GaAs Quantum Well Surface emitting laser", Collection of Synopses (Autumn, 2003) for the 64$^{th}$ Annual Meeting of the Japan Society of Applied Physics, 30a-YB-3. However, increasing the mesa diameter also increases the size of the oxidized area. This may result in the above-described problem relating to the internal stress of the oxidized layer, a problem described below and relating to the thermal resistance of nonconductive oxidized layer 117, made up of a steam oxidized film, a decrease in modulation rate resulting from an increase in the electric capacitance of the mesa-post, or degradation of the in-plane distribution of light emitting areas.

Another problem with the heat diffusion path 116 illustrated by arrow 3 is that the nonconductive oxidized layer 117, made up of the steam oxidized film, is included in the heat diffusion path toward substrate 113. That is, the nonconductive oxidized layer 117 (steam oxidized film) has an amorphous aluminum oxide-like composition, and thus its thermal conductivity is low. Improvement in thermal diffusion is difficult in such case. According to Non-Patent Document 2: Michael H. MacDougal, et al., "Thermal Impedance of VCSEL's with AlOx—GaAs DBR's", IEEE Photonics Technology Letters, Vol. 10, No. 1, pp. 15-17, 1998, which examines the thermal resistance of the VCSEL, the thermal conductivity of aluminum oxide is reported to be 0.255 W/cm$^{2.°}$ C. On the other hand, the thermal conductivities of GaAs and AlAs are 0.45 W/cm$^{2.°}$ C. and 0.9 W/cm$^{2.°}$ C., respectively. Thus, it is understood that, in comparison with those materials, the thermal conductivity of aluminum oxide, used for the nonconductive oxidized layer (steam oxidized film), is lower.

Next, with reference to FIGS. 6(a) to 6(c), it is also explained that the VCSEL with the trench-shaped oxide-confined structure, illustrated in the second and third conventional examples, has a similar problem relating to the thermal resistance. FIG. 6(a) is a plan view illustrating the VCSEL. Furthermore, FIGS. 6(b) and 6(c) are respectively sectional views illustrating the structures of half cross sections taken along lines F-F' and G-G' in FIG. 6(a). In the trench structure, the two types of half cross sections taken along lines F-F' and G-G' are present in group of the cross sections directed to the radial direction containing the substantial center of the current injection opening area. The former and the latter are half cross sections corresponding to a direction in which the cross section contains trench 201 and a direction in which the cross section contains no trench 201, respectively.

The half cross section taken along line G-G' is essentially equivalent to the half cross section of the mesa-post oxide-confined structure VCSEL except that p-DBR 109 located around the outer periphery of trench 201 is left without being etched and that high-resistance area 104 formed by proton implantation is present. That is, since the trench structure is formed at a finite distance from the center of the current injection opening area, a lateral heat diffusion path for heat diffusion from a portion of the heating-up area 115 facing to p-DBR 109 is limited. Moreover, the heat diffusion path from p-DBR 109 section toward the substrate 113 contains the nonconductive oxidized layer 117, made up of the steam oxidized film with the low thermal conductivity. Thus, such a structure also has a hurdle to be cleared away as to heat diffusion. On the other hand, in the half cross section taken along line F-F' and containing no trench 201, the absence of trench 201 reduces factors inhibiting the lateral heat diffusion. However, the half cross section taken along line F-F' is similar to that taken along line G-G' in that the heat diffusion path toward substrate 113 contains nonconductive oxidized layer 117, made up of the steam oxidized film with the low thermal conductivity. Thus, the half cross section taken along line F-F' also has a hurdle against heat diffusion.

The above-described problems with the trench-shaped oxide-confined structure VCSEL is more serious in highly integrated devices as shown in the third conventional example. That is, if the adjacent devices are arranged close to each other, a rise in temperature caused by heat generated in the driven VCSEL may have influence on the operation of the adjacent device. In order to inhibit the above-described adverse effect, the adjacent devices should be made thermally independent of each other. Such a structure will have such a problematic restriction that the heat diffusion path utilizing the lateral heat diffusion (for example, such a heat diffusion path as shown by arrow 5 in FIG. 6(*b*) or a path allowing more significant heat diffusion than the path shown by arrow 5) is no longer utilized actively.

In the two-dimensionally densely integrated array of VCSELs as shown in the third conventional example, if each of the devices is to be driven so as to exhibit performance equivalent to that exhibited when the VCSELs are not arrayed, possible electric, optical, and thermal crosstalk between the adjacent devices needs to be sufficiently inhibited. In the third conventional example, the nonconductive oxidized layer and the high-resistance area, arranged around the periphery of the current injection opening area, are used to inhibit the possible electric crosstalk. Furthermore, as the active layer contained in the high-resistance area serves as a light absorbing medium during driving, the possible optical crosstalk is suppressed to a negligible level. However, as described above, any consideration as to the possible thermal crosstalk is by no means made. Patent Document 5: JP 10-229248 A also fails to take the possible thermal crosstalk into account.

As described above, the conventional oxide-confined structures have problems to be solved for the purpose of reducing the internal stress and thermal resistance of the VCSELs. In particular, it is clearly revealed that the problems should be solved in order to achieve the high reliability of the high-speed modulation-type VCSELs.

Means for Solving the Problems

A surface emitting laser according to the present invention is:

a surface emitting laser comprising:

a single current injection opening area provided in a mesa and which is electrically and optically isolated, wherein the surface emitting laser comprising:

an active layer for emitting light resulted from current injection;

a first reflector and a second reflector provided so as to sandwich the active layer therebetween;

an n electrode and a p electrode for injecting current into the active layer;

an ion-implanted nonconductive high-resistance area provided so as to surround the current injection opening area; and a nonconductive oxidized layer extending from a side wall of the mesa to an interior of the mesa, and a half cross section in which the nonconductive oxidized layer does not appear is present among radial half cross sections extending from a substantial center of the current injection opening area to an outer periphery of the surface emitting laser, which cross sections are interrupted within a region where a laser emitting light is present.

In the surface emitting laser, among the radial half cross sections extending from the substantial center of the current injection opening area to the outer periphery of the surface emitting laser, the half cross section is present in which the nonconductive oxidized layer does not appear. Such a structure is successfully used to attain a reduction in internal stress and thermal resistance, and thereby high reliability can be achieved in the device.

Effect of Invention

According to the present invention, a surface emitting laser being excellent in reliability will be attained.

BRIEF DESCRIPTION OF THE DRAWINGS

In FIGS. 1 to 7, the following symbols have the following meaning:

101: mesa,
102: oxidized area,
103: non-oxidized area,
104: high-resistance area,
105: current injection opening area,
106: p electrode,
107: protection film,
108: polyimide,
109: p-DBR,
110: oxidizable layer,
111: active layer,
112: n-DBR,
113: substrate,
114: n electrode,
115: heating-up area,
116: heat diffusion path,
117: nonconductive oxidized layer (steam oxidized film),
201: trench,
301: wiring substrate,
701: high gain area

BEST MODE FOR CARRYING OUT THE INVENTION

Exemplary embodiments of a surface emitting laser according to the present invention will be described below in detail with reference to the drawings. In the description of the drawings, the same components are denoted by the same symbols, and duplicate descriptions are omitted.

First Exemplary Embodiment

Figure 1:
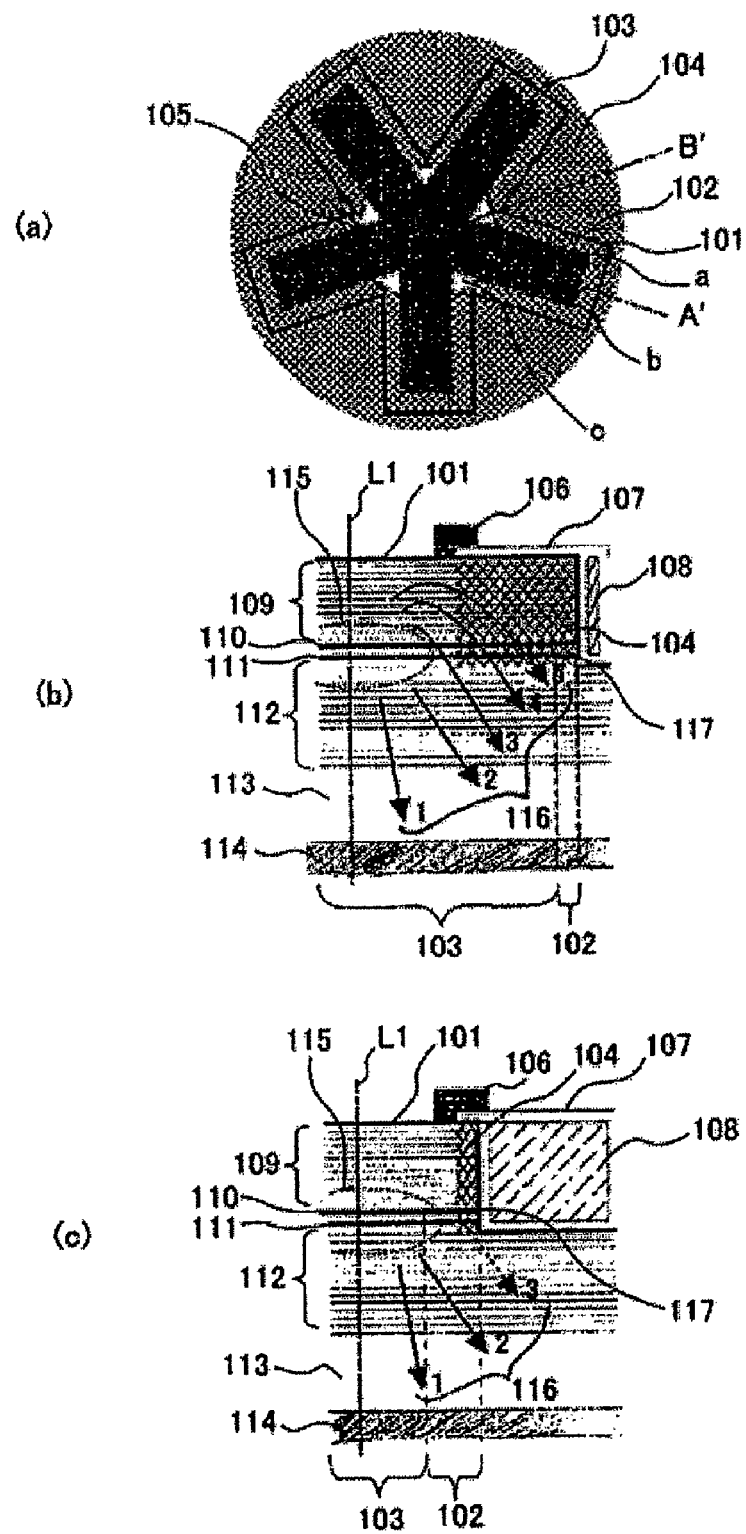
FIG. 1(*a*) is a plan view illustrating a first exemplary embodiment of a surface emitting laser according to the present invention, and FIGS. 1(*b*) and 1(*c*) are sectional views illustrating the structures of half cross sections taken along lines A-A' and B-B' in FIG. 1(*a*), respectively.

FIG. 1(a) is a plan view illustrating a first exemplary embodiment of a surface emitting laser according to the present invention. The surface emitting laser according to the first exemplary embodiment is of an oxide-confined structure type. FIGS. 1(b) and 1(c) are respectively sectional views illustrating the structures of half cross sections taken along lines A-A' and B-B' in FIG. 1(a). The half cross sections correspond to half cross sections extending from the substantial center of a current injection opening area to the outer periphery of the surface emitting laser.

In the first exemplary embodiment of the surface emitting laser according to the present invention, in connection with electric and optical functions within the range of the half cross section in which a light emitting area is present, the differences between the first exemplary embodiment and the conventional structure will be discussed. On the other hand, when the range of the half cross section is unlimitedly extended toward the outer periphery, such a nonconductive oxidized layer as explained below appears in the half cross section. Such a nonconductive oxidized layer that is present only in an area located far away from the light emitting area and the current injection opening area, is negligible provided that the nonconductive oxidized layer does not have influence on the operations of the light emitting area and the current injection opening area.

A process of manufacturing the surface emitting laser according to the first exemplary embodiment will be described.

First, a laser structure portion comprising a semiconductor layered structure is formed, by epitaxial growth, on substrate 113 made of, for instance, GaAs. As technique for the epitaxial growth, commonly employed is organic metal vapor phase chemical vapor deposition method (MOCVD method). However, another methods may be used for the epitaxial growth. Here, the semiconductor layered structure comprises n-DBR 112, active layer 111, oxidizable layer 110, p-DBR 109, and the like which are sequentially layered up on substrate 113. To obtain good device performance, a buffer layer, a highly doped layer, an intermediate layer, or the like may be appropriately interposed in addition to the above-described layers.

The detailed structure of active layer 111 is not illustrated. However, active layer 11 is composed of a multiple quantum well (MQW) structure made up of a layered structure a barrier layer of AlGaAs and a well layer of GaAs, and AlGaAs clad layers arranged at the opposite ends of the multiple quantum well structure. Active layer 11 is designed such that in terms of the wavelength of laser emitting light in the semiconductor, a total layer thickness is equal to one wavelength. The number of quantum wells is about three or four. The quantum well structure is designed to offer a gain peak near 850 nm when a VCSEL is driven at an environmental temperature of about 50° C.

p-DBR 109 and n-DBR 112 provide internal reflection required for the VCSEL structure. The lower DBR is typically formed of plural pairs made up of an AlGaAs layer with a high Al content and another AlGaAs layer with a low Al content. However, to achieve a reduction in electric resistance or the like, for example, a layer with a composition that is intermediate between the AlGaAs layer with the high Al content and the AlGaAs layer with the low Al content may be appropriately interposed between the AlGaAs layers. A conduction form is varied between the n-DBR and the p-DBR by using different dopants for the n-DBR and the p-DBR. The typical thickness of each layer pair is about 100 to 130 nm. The total thickness of each layer pair is designed to be equal to half the optical wavelength in the intended wavelength (lasing wavelength) of a laser operation.

The Al content x of the AlGaAs layer with the high Al content is, for example, about 0.86; Al belongs to the elements of the III group. The Al content x of the AlGaAs layer with the high Al content is high enough to provide a low refractive index but is not high enough to easily oxidize the AlGaAs layer. The Al content x of the AlGaAs layer with the low Al content is, for example, about 0.16. The Al content x of the AlGaAs layer with the low Al content generally contains a sufficient amount of Al to make the AlGaAs layer non-absorptive at the lasing wavelength. The reflectance of the p-DBR and n-DBR is the function of the difference in refractive index between the two AlGaAs layers and the number of layer pairs in the structure. The desired reflectance is obtained by appropriately selecting the refractive index difference and the number of pairs. In the first exemplary embodiment, a structure provided on a front surface side to obtain an optical output from the side facing to p-DBR 109 is described. Thus, the reflectance of p-DBR 109 is designed to be lower than that of n-DBR 112. To form n-DBR (back surface side DBR) 112, 30 to 40 pairs of alternate AlGaAs layers are generally used. Furthermore, to form p-DBR 109 (light emitting surface side DBR), 20 to 25 pairs of alternate AlGaAs layers are generally used.

Oxidizable layer 110 is made up of an AlGaAs layer with a high Al content x of, for example, at least 0.95; Al belongs to the elements of the III group. One oxidizable layer 110 is interposed either over or under the active layer or both over and under the active layer.

After the formation of the semiconductor layered structure is completed, an etching mask is formed by a conventional photography step. Subsequently, selective etching is performed to form mesa 101. In the formation of the mesa, etching depth is at least such that oxidizable layer 110 is exposed from a side surface of the mesa.

Now, the planar shape of the mesa will be described. The shape of the mesa according to the first exemplary embodiment is such that plurality of radially arranged stripes extending in a radial direction overlap in the center of the mesa, as illustrated in the plan view in FIG. 1(a). The five stripes are illustrated. This is because the shape of the current injection opening area which exhibits rotational symmetry an odd number of times in a circumferential direction enables effective inhibition of high-order modes in the circumferential direction during laser driving and is thus effective for lateral single mode operations. This is in turn because the high-order mode in the circumferential direction has an even number of peaks in the circumferential direction, so that the planar shape of the current injection opening area which exhibits symmetry an odd number of times provides a light emitting shape that does not align with any high-mode spots.

The mesa shape according to the spirit of the present invention is not limited to the one illustrated in the first exemplary embodiment. Another shape may be used. The desired mesa shape will be described below.

Then, an oxidation process is carried out on the semiconductor sample. The semiconductor sample is oxidized using steam in a nitrogen environment at a high temperature of, for example, about 40° C. During the oxidation process, the periphery of oxidizable layer 110 is exposed to hot steam. Oxidation progresses from the side wall toward the interior of the mesa to form nonconductive oxidized layer 117, made up of the steam oxidized film. Appropriately selecting time for the oxidation process results in the desired shape of nonconductive oxidized layer 117 (steam oxidized film) with respect to the final shape of the current injection opening area.

Figure 5:
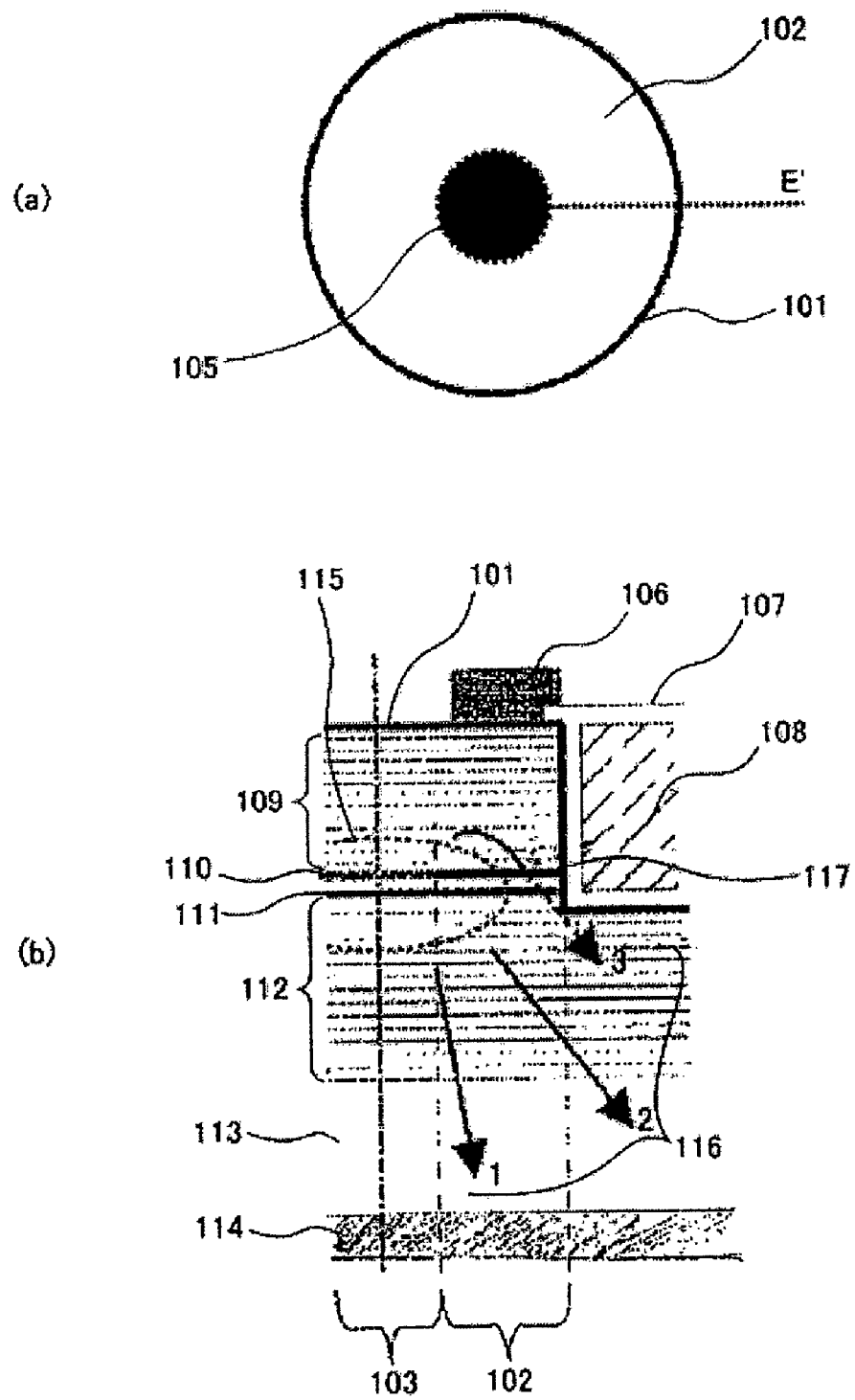
FIGS. 5(*a*) and 5(*b*) are respectively a plan view illustrating a surface emitting laser according to a first conventional example and a sectional view illustrating the structure of a half cross section of the surface emitting laser.

In the first exemplary embodiment, the radially arranged mesa stripes are oxidized so as to prevent oxidation fronts (a and b) extending from the opposite side surfaces from contacting each other. In the first exemplary embodiment, even after the oxidation process, relatively large non-oxidized area 103 almost similar to the mesa shape is left as shown in FIG. 5(a). Furthermore, when the oxidation process is completed, the final shape of the current injection opening area is not defined yet. That is, in the first exemplary embodiment, the shape of a closed current non-injection area surrounding light emitting area 105 is not completed simply by forming nonconductive oxidized layer 117, made up of the steam oxidized film. In other words, in the first exemplary embodiment of the present invention, nonconductive oxidized layer 117 is not solely used as means for providing a current control function for defining the shape of the current injection opening area.

After the oxidation process, high-resistance area 104 is formed in an area other than the vicinity of the central portion of the mesa using an ion implantation process. Ion implantation energy used for the ion implantation process is, for example, about 50 keV to 400 keV. The dose of ions implanted is, for example, $3 \times 10^{15}$ cm$^{-2}$ at each implantation energy level. In the VCSEL, ions used to form high-resistance area 104 are, for example, protons or oxygen ions.

Now, the planar shape of high-resistance area 104 formed by the ion implantation will be described. The shape of high-resistance area 104 in the first exemplary embodiment serves to increase the resistance of the peripheral portion of the mesa, that is, the entire mesa except for the circular shape in the central portion thereof. The radius of the substantially circular shape with the resistance thereof not increased is, for example, about 5 to 12 μm for VCSEL devices for 10-Gbps modulation. In this case, the shape of high-resistance area 104 is designed such that in connection with the planar overlapping shape relationship between high-resistance area 104 and oxidized area 102, an area (c in FIG. 1(a)) is left which is included in oxidized area 102 but not included in high-resistance area 104. The present ion implantation step forms the closed current non-injection area, surrounding the periphery of light emitting area 105. This determines the final current injection opening area in the VCSEL according to the first exemplary embodiment.

After the process for the high-resistance area 104, the following are carried out: a step of forming a buried structure comprising dielectric protection film 107 and polyimide 108 to reduce the electric capacitance of electrode pads, a step of producing p electrode 106 and n electrode 114 required to inject current, and other steps. As a result, the VCSEL device according to the first exemplary embodiment is completed.

Now, the advantage of the VCSEL according to the first exemplary embodiment over the conventional mesa-post oxide-confined structure in reducing the thermal resistance will be described. First, the sectional view in FIG. 1(c) illustrating the structure of the half cross section (B-B' half cross section) indicates that the sectional shape in the half cross section is the same as that of the mesa-post VCSEL, illustrated in FIG. 5(b), except that high-resistance area 104 is present near the side surface of the mesa. In the half cross section (B-B' half cross section), nonconductive oxidized layer 117, made up of the steam oxidized film, functions as a current limiter determining the current injection area in the cross section and a refractive index waveguide guiding laser light to the vicinity of the current injection opening area. In this regard, the first exemplary embodiment is similar to the first conventional example.

During lasing operation, heat is mainly generated by active layer 111 in non-oxidized area 103 and diffuses to the surroundings. This results in the formation of a hot area as schematically illustrated by heating-up area 115. Heat diffusion path 116 from heating-up area 115 toward substrate 113 is schematically illustrated by arrows 1 to 3. Here, part of the heat is diffused out from heating-up area 115 while spreading through an angle of about 45° as illustrated by arrows 1 and 2 for heat diffusion path 116. However, the path from the p-DBR-side portion of heating-up area 115 toward substrate 113 as illustrated by arrow 3 fails to serve as an effective heat diffusion path because the outer area of the mesa-post is generally covered with dielectric protection film 107 and polyimide 108, which offer low thermal conductivities, as is the case with the conventional example. Furthermore, even in the direction toward substrate 113, the only heat diffusion path is the heat diffusion path extending through nonconductive oxidized layer 117, made up of the steam oxidized film with the low thermal conductivity. As described above, the sectional structure in the half cross section taken along line B-B' is equivalent to that in the conventional mesa-post type. The heat diffusion in the sectional structure in the half cross section taken along line B-B' is not more advantageous than that in the conventional mesa-post type.

Now, the heat diffusion in the half cross section (A-A' half cross section) in FIG. 1(b) will be discussed. A structural characteristic of the half cross section is that the mesa is extended such that the side surface thereof is present away from the center of the current injection opening area. The extended mesa portion is an integrally formed semiconductor layered structure and thus offers a high thermal conductivity. Thus, in this structure, heat diffuses sufficiently in a lateral direction from the p-DBR 109-side portion of heating-up area 115. The paths to which the lateral diffusion of the heat contributes are schematically illustrated as paths included in heat diffusion path 116 and shown by arrows 4 and 5.

Furthermore, the radially extended mesa portion contains no nonconductive oxidized layer (steam oxidized film) even in the layered direction of the semiconductor and is formed only of the integrally formed layered structure. Thus, the heat diffused in the lateral direction along the paths shown by arrows 3, 4, and 5 is easily diffused out to the side facing to the substrate 113. This clearly indicates that the heat diffusion in the A-A' half cross section in this structure is improved compared to that in the oxide-confined structure in the first conventional example.

In the half cross section (A-A' half cross section), nonconductive oxidized layer 117, made up of the steam oxidized film, is positioned far away from the current injection opening area and doses not function as a current limiter or a refractive index waveguide. In the half cross section (A-A' half cross section), high-resistance area 104 functions as a current limiter. No refractive index waveguide is present in the half cross section (A-A' half cross section). The sectional structure of the half cross section (A-A' half cross section) is equivalent to that of a gain waveguide VCSEL comprising a current-confined structure by the use of only a proton implantation structure (high-resistance area). Owing to the absence of the refractive index waveguide structure utilizing nonconductive oxidized layer 117, in the half cross section (A-A' half cross section), the proton implantation structure (high-resistance area) extends substantially from the current injection opening area toward the radially outer periphery of the light emitting area.

The above discussions of the sectional structure will be summarized. In the first exemplary embodiment, in B-B' half cross section, a radially-directed half cross section passing through the center of the current injection opening area, nonconductive oxidized layer 117, made up of the steam oxidized film, functions as a current limiter and an intensive refractive index waveguide which are essential for high-speed modulation, which determines the range of the current injection opening area in the sectional direction. However, the heat diffusion in the B-B' half cross section is equivalent to that in the conventional oxide-confined structure. On the other hand, in the A-A' half cross section, another radially-directed half cross section, high-resistance area 104 functions as a substantial current limiter, and no refractive index waveguide is present. The heat diffusion in the A-A' half cross section is more excellent than that in the conventional oxide-confined structure. The first exemplary embodiment uses both the structures of the A-A' and B-B' cross sections in the radial direction. Thus, in connection with overall device performance, the first exemplary embodiment comprises the current-confined structure to provide both appropriate heat diffusion and an intensive refractive index waveguide mechanism suitable for high-speed modulation.

The structure of the first exemplary embodiment appears to have a hurdle to be cleared away as to the refractive index waveguide effect. That is, in the first exemplary embodiment, the oxide-confined structure, conventionally formed all along the radial direction, is formed only in the partial area in the radial direction. Thus, the structure of the first exemplary embodiment appears to exert a more insignificant refractive index waveguide effect than the conventional oxide-confined structure. However, in this regard, a significant refractive index waveguide effect equivalent to that of the conventional oxide-confined structure is obtained by increasing the layer thickness of oxidizable layer 110 or optimizing the location of oxidized layer 117 in the layered direction (for example, displacing oxidized layer 117 from the nodal position of a optical standing wave in the layered direction).

Finally, the characteristics of the structure of the first exemplary embodiment will be described again. That is, the first exemplary embodiment provides the VCSEL comprising the single current injection opening area and the planar structure surrounded by the high-resistance semiconductor area. As means for substantially determining the shape of the current injection opening area, at least two types of means are used which vary depending on the radial direction around the center of the current injection opening area. One of the means is the nonconductive oxidized layer made up of the steam oxidized film. One of the other means is the high-resistance area formed by ion implantation. In the first exemplary embodiment, the high-resistance area substantially provides the high-resistance semiconductor area (current non-injection area) surrounding the current injection opening area. The nonconductive oxidized layer made up of the steam oxidized film essentially functions only as a refractive index waveguide.

The provision of the above-described structure forms the structure characterized in that in at least one radial direction of the half cross section passing through the current injection opening area, the semiconductor layered structure comprising the active layer, the p-DBR, the n-DBR, and the like contains no nonconductive oxidized layer made up of the steam oxidized film. The first exemplary embodiment proposes the VCSEL configured such that the semiconductor layered structure contains the nonconductive oxidized layer made up of the steam oxidized film functioning as a refractive index waveguide, whereas the particular radially-directed half cross section passing through the center of the current injection opening area contains no such a nonconductive oxidized layer.

Second Exemplary Embodiment

Figure 2:
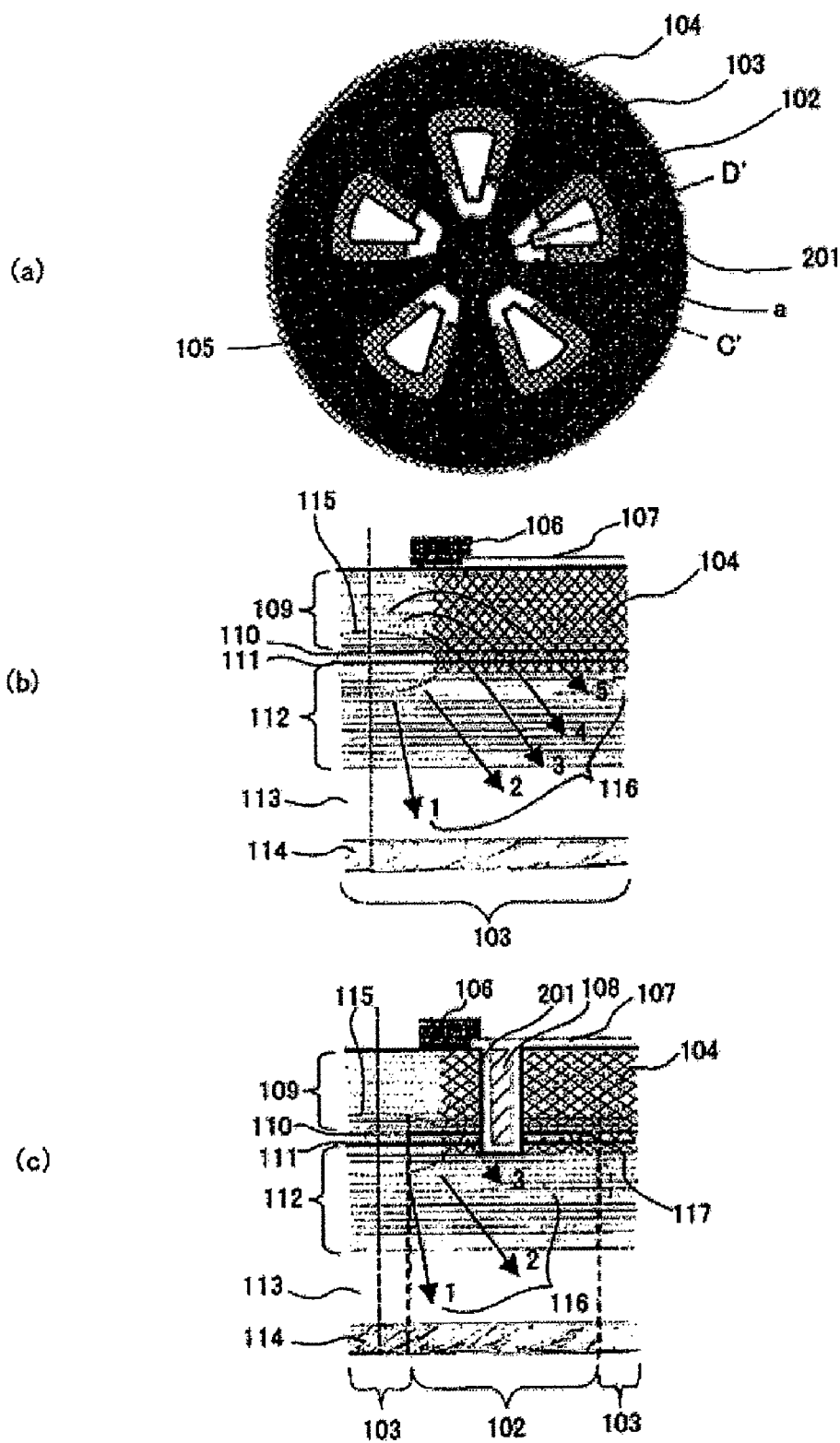
FIG. 2(*a*) is a plan view illustrating a second exemplary embodiment of a surface emitting laser according to the present invention, and FIGS. 2(*b*) and 2(*c*) are sectional views illustrating the structures of half cross sections taken along lines C-C' and D-D' in FIG. 2(*a*), respectively.

FIG. 2(a) is a plan view illustrating a second exemplary embodiment of a surface emitting laser according to the present invention. The surface emitting laser according to the second exemplary embodiment is of the oxide-confined structure type. FIGS. 2(b) and 2(c) are sectional views illustrating the structures of half cross sections taken along lines C-C' and D-D' in FIG. 2(a). The half cross sections correspond to half cross sections extending from the substantial center of the current injection opening area to the outer periphery of the surface emitting laser.

A process of manufacturing the surface emitting laser will be described. First, a laser structure portion comprising a semiconductor layered structure is formed, by epitaxial growth, on substrate 113 made of, for example, GaAs. Here, the semiconductor layered structure comprises substrate 113 on which n-DBR 112, active layer 111 comprising multiple quantum well structure, oxidizable layer 110, p-DBR 109, and the like are sequentially layered up. To obtain good device performance, a buffer layer, a highly doped layer, an intermediate layer, or the like may be appropriately interposed in addition to the above-described layers.

After the formation of the semiconductor layered structure is completed, an etching mask is formed on the layered structure by the conventional photography step. Subsequently, selective etching is performed to form trenches 201. The etching depth of each trench 201 is at least such that oxidizable layer 110 is exposed from a side surface of trench 201.

Here, the planar shape of trench 201 is obtained by taking a part of the central angle of a ring shape. However, the planar shape of the trench is not limited to the one shown in FIG. 2 but may be a circle, fan, a triangle, or the like. The trenches according to the second embodiment are radially arranged on a circumference around the final current injection opening area. Here, the number of the illustrated trenches is five. This is because the planar shape of the current injection opening area which exhibits rotational symmetry an odd number of times is effective in inhibiting high-order mode excitation.

Then, the semiconductor sample is oxidized in a nitrogen environment at a high temperature of about 400° C. using steam. During the oxidation process, oxidizable layer 110 is exposed to the surroundings, and the oxidation progresses from a side wall of each of the radially arranged trenches toward the interior of a non-trench portion. Thus, nonconductive oxidized layer 117, made up of the steam oxidized film, is formed. In the present exemplary embodiment, the plurality of radially arranged trenches are oxidized so as to prevent oxidation fronts starting to extend from the adjacent trench side walls from contacting each other. This is essentially different from that of the conventional trench oxidation structure including the second conventional example. In the second exemplary embodiment, even after the oxidation process, relatively large non-oxidized area 103 is left around the periphery of oxidized area 102 the shape of which is almost similar to the trench shape as illustrated in FIG. 2(a). After the oxidation process, a proton ion implantation process is used to implant ions into the final current injection opening area except for a substantially circular area thereof in the vicinity of the central portion thereof. High-resistance area 104 is thus formed.

Now, the planar shape of high-resistance area 104 formed by ion implantation will be described. The second exemplary embodiment increases the resistance of the entire peripheral portion of high-resistance area 104, that is, entire high-resistance area 104 except for a substantially circular area in the central portion thereof. The radius of the substantially circular area with the resistance not increased is, for example, about 5 to 12 μm for devices for 10-Gbps modulation. In this case, the shape of high-resistance area 104 is designed such that in connection with the planar overlapping shape relationship between high-resistance area 104 and oxidized area 102 starting to extend from each trench, an area (a in FIG. 2(a)) is left which is included in oxidized area 102 but not included in high-resistance area 104. The present ion implantation step forms the closed current non-injection area, surrounding the periphery of light emitting area 105. This determines the final current injection opening area in the VCSEL according to the second exemplary embodiment.

After the process of forming the high-resistance area 104, the following are carried out: the step of forming the buried structure comprising dielectric protection film 107 and polyimide 108 to reduce the electric capacitance of electrode pads, the step of producing p electrode 106 and n electrode 114 required to inject current, and other steps. As a result, the present device is completed.

Figure 6:
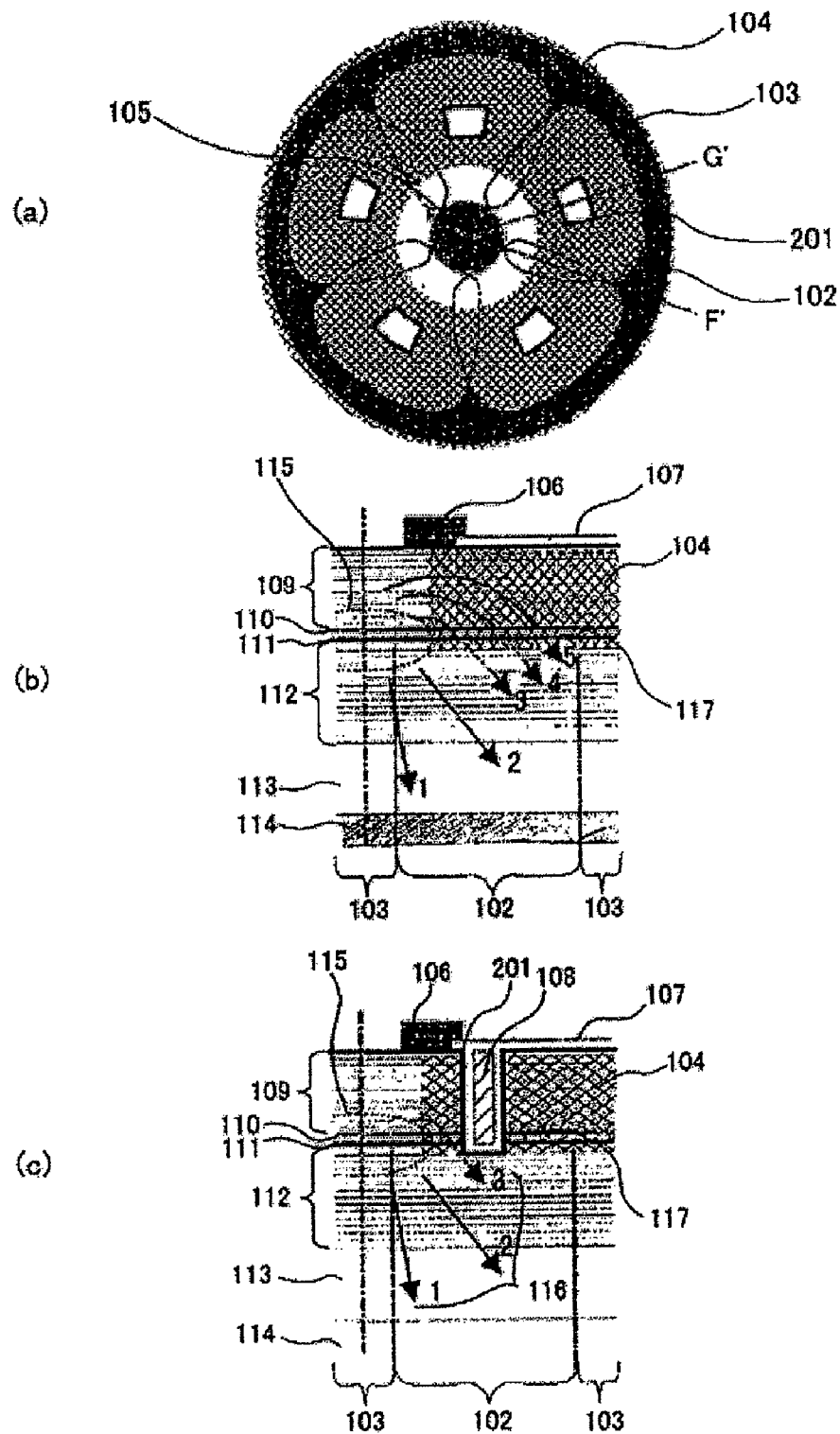
FIG. 6(*a*) is a plan view illustrating a surface emitting laser according to a second conventional example, and FIGS. 6(*b*) and 6(*c*) are sectional views illustrating the structures of half cross sections taken along lines F-F' and G-G' in FIG. 6(*a*), respectively.

Now, the advantage of the VCSEL according to the second exemplary embodiment over the conventional trench structure in reducing the thermal resistance will be described. First, the sectional view in FIG. 2(c) indicates that the illustrated sectional shape is exactly the same as that of a half cross section of the conventional trench-shaped oxide-confined VCSEL, the cross section containing a trench portion as shown in FIG. 6(c). In the half cross section (D-D' half cross section), nonconductive oxidized layer 117, made up of the steam oxidized film, functions as a current limiter determining the current injection area and a refractive index waveguide guiding laser light to the vicinity of the current injection opening area. In this regard, the second exemplary embodiment is similar to the second conventional example. Thus, in connection with heat diffusion, as is the case with the second conventional example, the path included in heat diffusion path 116 and shown by arrow 3 cannot serve as an effective heat diffusion path because the trench portion is covered with dielectric protection film 107 and polyimide 108, which offer low thermal conductivities. Furthermore, in the direction toward substrate 113, the only heat diffusion path passes through the nonconductive oxidized layer 117, made up of the steam oxidized film with the low thermal conductivity. Consequently, the second exemplary embodiment still has a hurdle to be cleared up as to the heat diffusion. This is exactly the same as that in the second conventional example.

Now, the heat diffusion in the half cross section in FIG. 2(b) will be discussed. A structural characteristic of the half section (C-C' cross section) is that no trench or nonconductive oxidized layer (steam oxidized film) is present at any radial position from the center to exterior of the current injection opening area. On the other hand, in the trench-shaped oxide-confined structure illustrated in the second conventional example, the half cross section in FIG. 6(b), which contains no trench, contains no trench in the radial direction but contains nonconductive oxidized layer 117, made up of the steam oxidized film, in the heat diffusion path from p-DBR 109 toward substrate 113.

In connection with the above-described differences, the heat diffusion in the C-C' half cross section in the second exemplary embodiment is compared with that in the F-F' half cross section in the second conventional example. The two half cross sections are equivalent in terms of the heat diffusion due to the lateral heat diffusion in the paths included in heat diffusion path 116 and schematically illustrated by arrows 3, 4, and 5. However, for the heat diffusion path toward substrate 113, the second exemplary embodiment is more excellent because of the lack, in the heat diffusion path, of nonconductive oxidized layer 117, made up of the steam oxidized film. In the C-C' half cross section, high-resistance area 104 functions as a current limiter. No refractive index waveguide is present in the C-C' half cross section. The sectional structure of the C-C' half cross section is thus equivalent to that of a gain waveguide VCSEL that achieves current-confined only by the use of a proton implantation structure.

The above discussions will be summarized. In the second exemplary embodiment, in D-D' half cross section, a radially-directed half cross section passing through the center of the current injection opening area, as in the case of the conventional oxide-confined structure shown in the first conventional example, nonconductive oxidized layer 117, made up of the steam oxidized film, functions as a current limiter and an intensive refractive index waveguide which are essential for high-speed modulation. The heat diffusion in the D-D' half cross section is also equivalent to that in the conventional oxide-confined structure. On the other hand, in the C-C' half cross section, another radially-directed cross section, high-resistance area 104 functions as a substantial current limiter, and no refractive index waveguide is present. Furthermore, the heat diffusion in the C-C' half cross section is more excellent than that in the conventional oxide-confined structure. The second exemplary embodiment uses both the structures of the C-C' and D-D' cross sections in the radial direction. Thus, in view of overall device performance, the second exemplary embodiment provides both appropriate heat diffusion and an intensive refractive index waveguide mechanism required for high-speed modulation.

Figure 7:
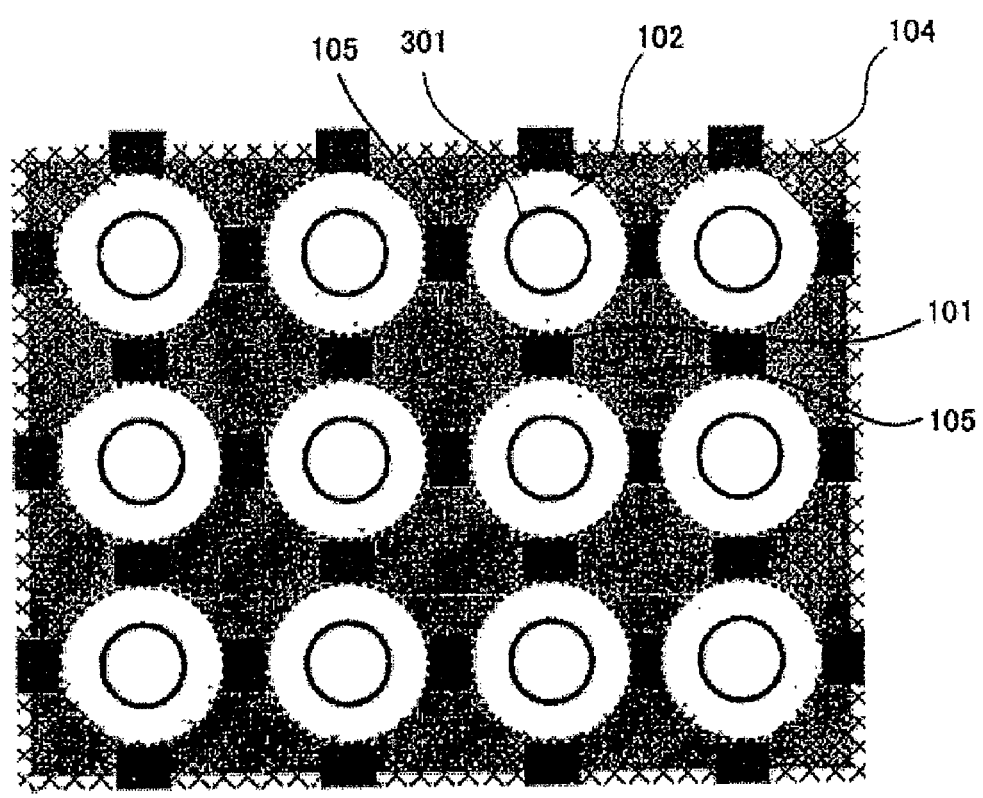
FIG. 7 is a plan view illustrating a surface emitting laser according to a third conventional example.

Patent Document 2: JP. 2005-45243 A proposes a structure similar to the VCSEL with the trench-shaped oxide-confined structure according to the second exemplary embodiment in that the oxidation fronts starting to extend from the adjacent trenches are prevented from contacting each other. The structure disclosed in Patent Document 2 will be described with reference to a plan view in FIG. 7. The conventional example disclosed in Patent Document 2 is an oxide-confined structure VCSEL array utilizing two-dimensionally arranged trenches 201. For the oxide-confined structure VCSEL array, the steam oxidation process is carried out to the degree that the fronts of oxidized area 102 starting to extend from the adjacent trenches are prevented from contacting each other. The non-oxidized area left between the adjacent VCSELs so as to form a phased array is used as a high gain area. When the phased array VCSELs are driven, lasing light beams emitted perpendicularly to the substrate through the opening of each laser are coupled together. Thus, spontaneous emission light emitted in a substrate in-plane direction is amplified in high gain area 701 and are laterally diffused to irradiate the adjacent VCSEL. Thus, the gains of the adjacent VCSELs are coupled together via high gain area 701. Consequently, all of the two-dimensional VCSEL phased array comes into lasing at the same phase. In such a case, the current injection provides the high gain area 701 with the optical gains, and the area acts as a heating source due to the current injection.

In the conventional example disclosed in Patent Document 2, to implement the optical phased array composed of the two-dimensional VCSEL array, the adjacent devices are electrically coupled together to inject current at the same phase. Furthermore, high gain area 701 is provided to positively take advantage of optical mode coupling. Therefore, the two-dimensional VCSEL phased array in the conventional example disclosed in Patent Document 2 is structurally similar to the second exemplary embodiment only in that oxidation is performed so as to prevent the oxidation fronts starting to extend from the adjacent trenches from contacting each other. However, the structure in the conventional example is essentially different from that in the second exemplary embodiment in that current is injected into the non-oxidized area. In the second exemplary embodiment, the adjacent ones of the two-dimensionally arrayed VCSELs avoid being electrically or optically coupled together. Furthermore, the second exemplary embodiment is intended to improve the operating speed and reliability of each VCSEL device. The structure of the second exemplary embodiment is thus essentially different from the conventional example disclosed in Patent Document 2. The VCSEL phased array in the conventional example disclosed in Patent Document 2 utilizes the spontaneous emission light in the substrate plane direction for mode coupling in order to allow lasing of a plurality of light emitting points at the same phase to turn on. However, the thus configured VCSEL phased array allows the spontaneous emission light to last longer and is unsuitable for high-speed modulation.

Third Exemplary Embodiment

Figure 3:
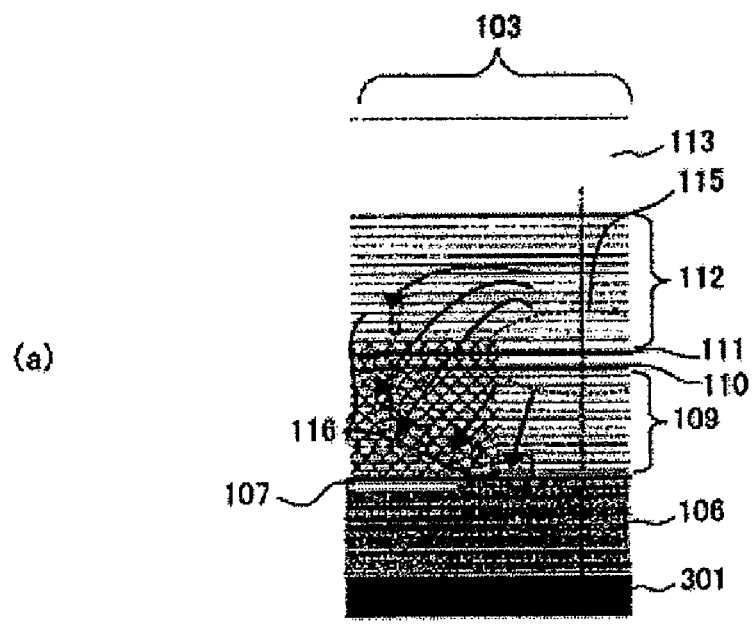
FIGS. 3(*a*) and 3(*b*) are sectional views illustrating the structures of two types of half cross sections according to a third exemplary embodiment of a surface emitting laser according to the present invention, respectively.
Figure 3:
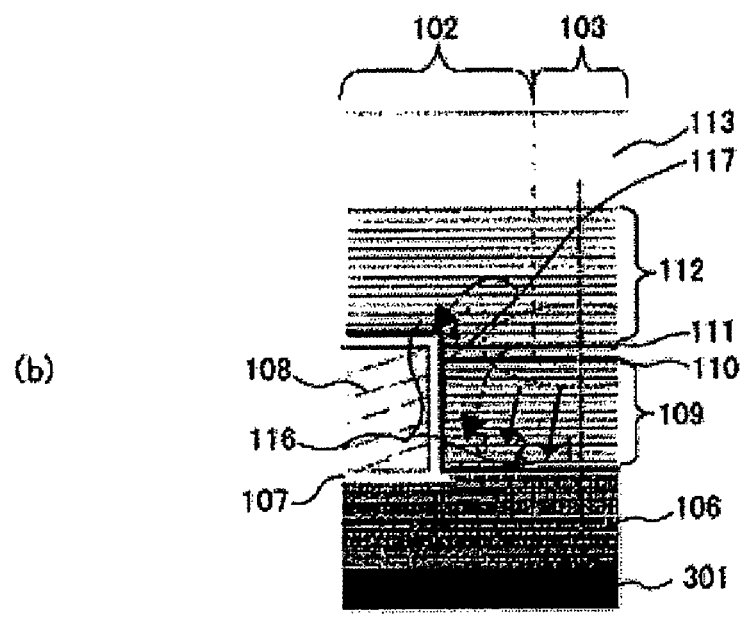

FIGS. 3(a) and 3(b) are sectional views illustrating a third exemplary embodiment of a surface emitting laser according to the present invention. The surface emitting laser according to the third exemplary embodiment is of the oxide-confined structure type. A plan view of the surface emitting laser according to the third exemplary embodiment is similar to FIG. 1(a). FIGS. 3(b) and 3(c) are sectional views illustrating the structures of half cross sections taken along lines A-A' and B-B' in FIG. 1(a). The half cross sections correspond to half cross sections extending from the substantial center of the current injection opening area to the outer periphery of the surface emitting laser.

The laser structure is essentially similar to that described in the first embodiment. The third exemplary embodiment is different from the first exemplary embodiment in that the substrate side corresponds to a light emitting surface and the VCSEL is mounted on wiring substrate 301 by flip chip mounting and in that main heat diffusion path 116 is not located on substrate 113 side but on wiring substrate 301 side via p electrode 106. A process of manufacturing a VCSEL according to the third exemplary embodiment is similar to that according to the first exemplary embodiment and will thus not be described below.

In the case of flip chip mounting where heat is mainly diffused out from the side of the laser structure portion formed on the substrate, more attention needs to be paid to heat diffusion than in the case where heat is diffused out from the substrate side. As is the case with the discussion in the first exemplary embodiment, part of the heat is diffused out from heating-up area 115 while spreading through an angle of about 45° as illustrated by arrows 1 and 2 for heat diffusion path 116. However, with the flip chip mounting, even for the paths shown by arrows 1 and 2, the area in which the heat can diffuse in the lateral direction is limited to the range within which mesa 101 is formed. This is in contrast to the heat diffusion to the substrate side in the first exemplary embodiment, in which for the paths shown by arrows 1 and 2 in FIG. 1(c), the lateral heat diffusion is not limited. Thus, the heat diffusion in the flip chip mounting is more disadvantageous than the heat diffusion to the substrate side unless any special measure is taken.

The third exemplary embodiment is also similar to the first exemplary embodiment in that for the path shown by arrow 3, the area outside the mesa-post is covered with dielectric protection film 107 and polyimide 108, which generally offer low thermal conductivities, and in that nonconductive oxidized layer 117, made up of the steam oxidized film with the low thermal conductivity, is present on the heat diffusion path leading to p electrode 106 and the wiring substrate 301 to hinder the heat diffusion. As described above, it is revealed that the heat diffusion in the B-B' half cross section still has a problem to be solved. The mesa-post VCSEL in the first conventional example has the shape of this half cross section all along the radial direction surrounding the light emitting area. Thus, obviously, even with the flip chip mounting, the mesa-post VCSEL as shown in the first conventional example has a problem to be solved regarding to the heat diffusion from the device as a whole.

Now, the heat diffusion in the A-A' half cross section will be described. A structural characteristic of the half cross section is that the mesa is extended such that the side surface thereof is present away from the center of the current injection opening area. The extended mesa portion is an integrally formed semiconductor layered structure and thus offers a high thermal conductivity. Thus, in this structure, heat diffuses sufficiently in the lateral direction from heating-up area 115. The lateral heat diffusion is schematically illustrated as paths included in heat diffusion path 116 and shown by arrows 4 and 5. Furthermore, the mesa portion extended in the radial direction contains no nonconductive oxidized layer made up of the steam oxidized film but is formed only of the integrally formed semiconductor layered structure. Thus, heat diffusing in the lateral direction along the paths shown by arrows 3, 4, and 5 is easily diffused out to the side facing to p electrode 106. As a result, the A-A' half cross section illustrated in FIG. 3(a) provides improved heat diffusion compared to the conventional oxide-confined structure.

The above discussions will be summarized. The third exemplary embodiment, which is the flip chip mounting form, uses, in the radial direction, both the A-A' structure, which is more excellent than the conventional oxide-confined structure in lateral and vertical heat diffusion, and the B-B' structure, which is equivalent to the conventional oxide-confined structure in heat diffusion but which uses nonconductive oxidized layer 117, made up of the steam oxidized film, to enable provision of an intensive refractive index waveguide equivalent to that in the conventional oxide-confined structure. Thus, in view of the overall device performance, the third exemplary embodiment provides both appropriate heat diffusion and an intensive refractive index waveguide mechanism required for high-speed modulation.

In the description of the third exemplary embodiment, the mesa-post VCSEL according to the first exemplary embodiment is subjected to flip chip mounting. However, similar effects can be exerted by subjecting the trench structure VCSEL according to the second exemplary embodiment to flip chip mounting.

Fourth Exemplary Embodiment

A surface emitting laser according to a fourth embodiment of the present invention will be described. The surface emitting laser according to the fourth exemplary embodiment is a holey VCSEL. In recent years, efforts have been made to form a plurality of radial trenches in a part of a current injection opening area of a VCSEL in which an optical field is present and to positively take advantage of an intensive optical waveguide effect due to a significant difference in refractive index between each trench and the semiconductor to achieve improvement of a single mode optical output from the VCSEL, a reduction in the lasing threshold of the VCSEL, and the like. As a VCSEL with this structure, the holey VCSEL or a photonic crystal VCSEL has been proposed.

Conventional examples of the above-described VCSELs are holey VCSELs in Patent Document 4: JP 2005-310917 A and Non-Patent Document 3: P. O. Leisher, et al., "Proton implanted single mode holey vertical-cavity surface-emitting lasers", Electronics Letters, Volume 41, Issue 18, Sep. 1, 2005, pp. 1010-1011. In these VCSELs, wedge-shaped trenches are radially arranged in the vicinity of the current injection opening area so that light is guided by the use of the significant difference in refractive index between the trench and the semiconductor layered structure.

In Patent Document 4, trenches (holes) each with light shielding component provided on a bottom surface and an inner side surface thereof are formed in a p-DBR section located immediately above a current injection opening area in a mesa-post oxide-confined structure in order to control lateral modes. In the VCSEL described in Patent Document 4, a nonconductive oxidized layer made up of a steam oxidized film is used as a current limiter. The trenches each with the light shielding component provided on the bottom surface and inner side surface thereof are used as a refractive index waveguide.

On the other hand, in Non-Patent Document 3, proton implantation is used as a current limiter. The trenches are used as a refractive index waveguide component.

The above described conventional holey VCSEL poses a problem relating to the manufacture of devices. That is, to exert an intensive waveguide effect, deep trenches each with a very small opening size need to be accurately formed. Furthermore, since wave-guided light comes into direct contact with a side wall of the trench, the side wall needs to be smooth enough to prevent a possible optical loss caused by optical scattering. However, in actuality, a very advanced technique is required to form the trench with the very small opening size such that the trench is sufficiently smooth at any positions in the depth direction. Sufficiently uniformly producing devices with the above-described structure at a sufficient yield is difficult.

Figure 4:
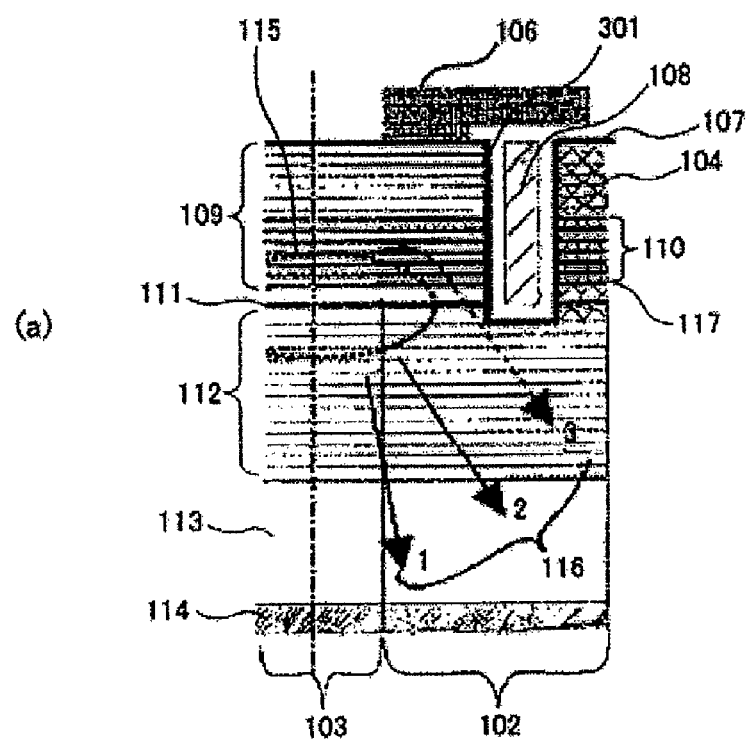
FIGS. 4(*a*) and 4(*b*) are sectional views illustrating the structures of two types of half cross sections according to a fourth exemplary embodiment of a surface emitting laser according to the present invention, respectively.
Figure 4:
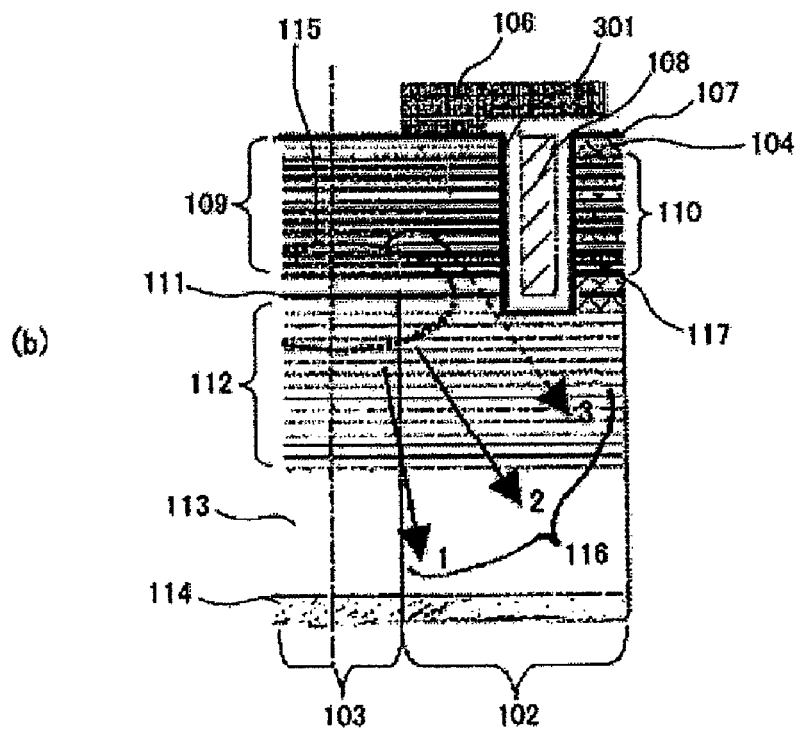

The fourth embodiment can avoid the above-described problems with the conventional holey VCSEL. The planar shape of the holey VCSEL according to the fourth embodiment is the same as that in FIG. 2(a). FIGS. 4(a) and 4(b) are sectional views illustrating the structures, according to different exemplary embodiments, of the D-D' half cross section in the plan view in FIG. 2(a). The half cross section structures in FIGS. 4(a) and 4(b) are characterized in that a plurality of oxidizable layers 110 are interposed in the layered direction. In the conventional oxide-confined VCSEL, in general, one oxidizable layer is provided either over or under the active layer or both over and under the active layer. However, in the fourth exemplary embodiment, to exert the intensive refractive index waveguide effect of the holey VCSEL, at least two oxidizable layers are arranged over or under the active layer or both over and under the active layer.

In FIG. 4(a), a plurality of oxidizable layers of the same composition are interposed over the active layer. Moreover, in FIG. 4(b), a more detailed waveguide structure is designed by varying the aluminum content among the interposed oxidizable layers to vary the extension width of the steam oxidized film, used for nonconductive oxidized layer 117, formed in the steam-oxidation confining step. In FIG. 4(b), specifically, the contact area of p electrode 106 is increased by designing oxidized area 102 such that the width of oxidized area 102 decreases as oxidized area 102 approaches the device surface.

First, the heat diffusion according to the fourth exemplary embodiment will be described. In the sectional views in FIGS. 4(a) and 4(b), illustrating the half cross section structures, the path included in heat diffusion path 116 and shown by arrow 3 has difficulty providing appropriate heat diffusion owing to the presence of the plurality of nonconductive oxidized layers (steam oxidized films), polyimide 108, and dielectric protection film 107. However, the C-C' half cross section in the plan view in FIG. 2(a) contains no nonconductive oxidized layer (steam oxidized film) or trench in the semiconductor layered structure according to the spirit of the present invention. This allows appropriate heat diffusion to be maintained. If a similar structure is manufactured to have the planar shape of the mesa-post oxide-confined structure in the first conventional example or of the trench-shaped oxide-confined structure in the second conventional example, a plurality of nonconductive oxidized layers (steam oxidized films) are provided in all orientations of the radial direction surrounding the light emitting area. This is a major problem not only for heat diffusion but also for electric resistance and internal stress.

Now, the intensive waveguide effect, which is characteristic of the fourth exemplary embodiment, and productivity achieved by the intensive waveguide effect will be described. In the fourth exemplary embodiment, the intensive refractive index waveguide effect is exerted by the plurality of nonconductive oxidized layers (steam oxidized films). In this regard, the fourth embodiment is equivalent to the holey VCSEL utilizing the side wall of the trench as described above. However, in the conventional example, all of the side wall is used as an optical waveguide mechanism, whereas in the fourth embodiment, only the tip of each of the nonconductive oxidized layers (steam oxidized films) periodically formed in the layered direction is involved in optical wave guiding, and the side wall of the low aluminum-composition layer, into which oxidation is prevented from advancing, is not substantially involved in optical wave guiding. This means that the conventional example requires the "surface" smoothness of the trench side wall, whereas the fourth exemplary embodiment requires only the "line" smoothness of the oxidizable layer. Thus, the structure of the fourth exemplary embodiment is less sensitive to the influence due to the roughness of the trench side wall and is thus more productive.

Another characteristic of the fourth exemplary embodiment is the ability to reduce the total layer thickness of p-DBR 109, which is required to obtain the desired reflectance. AlGaAs or AlAs, having a higher aluminum content than AlGaAS, utilized for a low refractive-index layer in p-DBR 109, is normally utilized to form nonconductive oxidized layer 117, made up of the steam oxidized film. In this case, the refractive index of the oxidizable layer 110 is lower than that of the low refractive-index layer in p-DBR 109. Thus, in a structure in which the oxidizable layers 110 are periodically interposed instead of the low refractive-index layer in p-DBR 109, the difference in refractive index between a high refractive-index layer in p-DBR 109 and the oxidizable layer 110 is larger in a central portion of the structure. This results in an increase in the reflectance of each periodic structure pair. Furthermore, the refractive index of nonconductive oxidized layer 117, made up of the steam oxidized film and produced by steam-oxidizing the oxidizable layer 110, is lower than that of the oxidizable layer 110. This further increases the difference in refractive index between the high refractive-index layer in p-DBR 109 and nonconductive oxidized layer 117, in an area in which nonconductive oxidized layer 117, made up of the steam oxidized film, is formed. This results in a further increase in the reflectance of each periodic structure pair. Therefore, the reflectance of each periodic structure pair increases in both the central portion, in which oxidizable layer 110 is left, and the area in which nonconductive oxidized layer 117, made up of the steam oxidized film, is formed. This enables a reduction in the total layer thickness of the DBR, which is required to obtain the desired reflectance.

In this case, the high refractive-index layer in p-DBR 109, included in each periodic structure pair, is common to the central portion, in which oxidizable layer 110 is left, and the area in which nonconductive oxidized layer 117, made up of the steam oxidized film, is formed. However, the refractive index of oxidizable layer 110, functioning as a low refractive-index layer, is different from that of nonconductive oxidized layer 117. As a result, an effective difference in refractive index is present between the central portion, in which oxidizable layer 110 is left, and the area in which nonconductive oxidized layer 117, made up of the steam oxidized film, is formed. The central portion forms a high refractive-index area. The area in which nonconductive oxidized layer 117, made up of the steam oxidized film, is formed forms a low refractive-index area. This allows a core/clad refractive-index waveguide effect to be exerted.

A technique of forming a p-DBR composed of a layered structure of a semiconductor and a nonconductive oxidized layer made up of a steam oxidized layer to provide a high-reflectance p-DBR is also discussed in Non-Patent Document 1. However, in the structure of the fourth exemplary embodiment, such a high-reflectance p-DBR is formed in half cross sections extending in the respective directions on a part of the circumference surrounding the current injection opening area. The ability to reduce the layer thickness of p-DBR reduces the series resistance of the p-DBR section and also reduces the required trench depth to improve the smoothness of the trench side wall. This is advantageous in device performance and productivity.

The first to fourth exemplary embodiments provide the oxide-confined VCSEL comprising the single current injection opening area and the structure the periphery of which is surrounded by the high-resistance area, the oxide-confined VCSEL being characterized in that in at least one direction of the radial direction surrounding the current injection opening area, substantially no nonconductive oxidized layer made up of the steam oxidized film is contained in the layered structure extending from the p-DBR through the active layer and the n-DBR to the semiconductor substrate. The structure according to the present invention improves the heat diffusion, toward the substrate or the VCSEL surface, of heat generated in the vicinity of the active layer. This enables the reliability to be improved.

The material type, dopant used for semiconductor, its doping level, and size for the semiconductor, metal, dielectric, and organic material adopted in the embodiments of the present invention are illustrative. The combination of the parameters for the elements forming the device may be varied. Moreover, another layer may be added to the illustrated layered structure. Furthermore, conditions utilized during the production process, for example, temperature and time, can be appropriately varied depending on the materials utilized. Finally, instead of GaAs and GaAlAs, InGaAs, GaAlSb, InAlGaP, InGaAsP, InGaAsN, or another semiconductor material such as a semiconductor alloy in the III-V group or II-VI group may be used.

Furthermore, for the structure of the VCSEL device, the present invention is applicable to either of the surface emitting type or the substrate surface emitting type. In connection with the structure of a laser diode, in connection with the layered direction of the semiconductor layer formed on the substrate, that is, the direction of a pn junction, is selected such that the substrate side corresponds to the n type. However, the substrate side may be selected to correspond to the p type. Moreover, for the above-described mounting forms, it is possible to adopt not only the form in which the substrate side is mounted on a heat sink or a wiring substrate as in the case of the first embodiment but also the flip chip mounting scheme as in the case of the third embodiment. Furthermore, the p and n electrodes may be formed at any positions provided that the completed device can emit light when the current injection opening area is energized. For example, instead of a form in which one of the p and n electrodes is provided on the substrate side, whereas the other is provided on the device surface, a form may be adopted in which both the p and n electrodes are provided on the device surface side.

The invention claimed is:

1. A surface emitting laser comprising:
   a single current injection opening area used for the laser, which is provided in a mesa,
   wherein the single current injection opening area used for the laser is electrically and optically isolated from a current injection opening area used for other lasers, which are formed on a same substrate;
   the surface emitting laser comprising:
   an active layer for emitting light resulted from current injection;
   a first reflector and a second reflector provided so as to sandwich the active layer therebetween;
   an n electrode and a p electrode for injecting current into the active layer;
   an ion-implanted nonconductive high-resistance area provided so as to surround the current injection opening area; and a nonconductive oxidized layer extending from a side wall of the mesa to an interior of the mesa, and a half cross section in which the nonconductive oxidized layer does not appear is present among radial half cross sections extending from a substantial center of the current injection opening area to an outer periphery of the surface emitting laser, which cross sections are interrupted within a region where a laser emitting light is present.

2. A surface emitting laser comprising:
   a single current injection opening area used for the laser; and a plurality of trenches arranged substantially radially in a plan view around a substantial center of the current injection opening area, wherein the single current injection opening area used for the laser is electrically and optically isolated from a current injection opening area used for other lasers, which are formed on a same substrate;
   the single current injection opening area used for the laser is electrically and optically isolated from a current injection opening area used for other lasers, which are formed on a same substrate;
   the surface emitting laser comprising:
   an active layer for emitting light resulted from current injection;
   a first reflector and a second reflector provided so as to sandwich the active layer therebetween;
   an n electrode and a p electrode for injecting current into the active layer;
   an ion-implanted nonconductive high-resistance area provided so as to surround the current injection opening area; and a nonconductive oxidized layer extending from a side wall of the trenches to an exterior of the trenches, and a half cross section in which the nonconductive oxidized layer does not appear is present among radial half cross sections extending from a substantial center of the current injection opening area to an outer periphery of the surface emitting laser, which cross sections are interrupted within a region where a laser emitting light is present.

3. The surface emitting laser as claimed in claim 2, wherein the nonconductive oxidized layers are formed by using the plurality of trenches to be respectively provided so as to surround the each of the plurality of trenches, and the plurality of nonconductive oxidized layers do not contact with each other in a plan view.

4. The surface emitting laser as claimed in claim 1, wherein the current injection opening area is bounded by the high-resistance area and the nonconductive oxidized layer in a plan view, and both the high-resistance area and the nonconductive oxidized layer are provided at positions where the high-resistance area and the nonconductive oxidized layer is substantially in spatial contact with the laser emitting light.

5. The surface emitting laser as claimed in claim 1, wherein the high-resistance area and the nonconductive oxidized layer are provided along a circumferential direction around the substantial center of the current injection opening area, and are also used as means for bounding the current injection opening area.

6. The surface emitting laser as claimed in claim 1, wherein a planar shape of the current injection opening area substantially exhibits n times rotational symmetry (n: an odd number equal to or larger than 3).

7. The surface emitting laser as claimed in claim 1, wherein the nonconductive oxidized layer is a nonconductive oxidized layer comprising a steam oxidized film formed by steam oxidation.

8. The surface emitting laser as claimed in claim 7, wherein three or more nonconductive oxidized layers are provided as the nonconductive oxidized layer, a semiconductor distributed Bragg reflector comprising semiconductor layers with a side end contacting the nonconductive oxidized layers and semiconductor layers with a side end not contacting the nonconductive oxidized layers is constructed, in the semiconductor distributed Bragg reflector, a side wall of the semiconductor layers with the side end not contacting the nonconductive oxidized layers does not substantially have influence on a light intensity distribution of laser emitting light.

9. The surface emitting laser as claimed in claim 1, wherein a heat sink or a wiring substrate is bonded to a back surface of a substrate of the surface emitting laser, and a main heat diffusion path for heat generated in the active layer is a path passing through the heat sink or the wiring substrate.

10. The surface emitting laser as claimed in claim 1, wherein a heat sink or a wiring substrate is bonded to a surface of the surface emitting laser which is opposite to that of the substrate, and a main heat diffusion path for heat generated in the active layer is the path passing through the heat sink or the wiring substrate.

11. The surface emitting laser as claimed in claim 2, wherein the current injection opening area is bounded by the high-resistance area and the nonconductive oxidized layer in a plan view, and both the high-resistance area and the nonconductive oxidized layer are provided at positions where the high-resistance area and the nonconductive oxidized layer is substantially in spatial contact with the laser emitting light.

12. The surface emitting laser as claimed in claim 2, wherein the high-resistance area and the nonconductive oxidized layer are provided along a direction around the substantial center of the current injection opening area, and are also used as means for bounding the current injection opening area.

13. The surface emitting laser as claimed in claim 2, wherein a planar shape of the current injection opening area substantially exhibits n times rotational symmetry (n: an odd number equal to or larger than 3).

14. The surface emitting laser as claimed in claim 2, wherein the nonconductive oxidized layer is a nonconductive oxidized layer comprising a steam oxidized film formed by steam oxidation.

15. The surface emitting laser as claimed in claim 14, wherein three or more nonconductive oxidized layers are provided as the nonconductive oxidized layer, a semiconductor distributed Bragg reflector comprising semiconductor layers with a side end contacting the nonconductive oxidized layers and semiconductor layers with a side end not contacting the nonconductive oxidized layers is constructed, in the semiconductor distributed Bragg reflector, a side wall of the semiconductor layers with the side end not contacting the nonconductive oxidized layers does not substantially have influence on a light intensity distribution of laser emitting light.

16. The surface emitting laser as claimed in claim 2, wherein a heat sink or a wiring substrate is bonded to a back surface of a substrate of the surface emitting laser, and a main heat diffusion path for heat generated in the active layer is a path passing through the heat sink or the wiring substrate.

17. The surface emitting laser as claimed in claim 2, wherein a heat sink or a wiring substrate is bonded to a surface of the surface emitting laser which is opposite to that of the substrate, and a main heat diffusion path for heat generated in the active layer is the path passing through the heat sink or the wiring substrate.

* * * * *